(12) United States Patent
Nguyen-Tuong et al.

(10) Patent No.: US 9,805,313 B2
(45) Date of Patent: Oct. 31, 2017

(54) METHOD AND APPARATUS FOR SUPPLYING INTERPOLATION POINT DATA FOR A DATA-BASED FUNCTION MODEL CALCULATION UNIT

(71) Applicant: Robert Bosch GmbH, Stuttgart (DE)

(72) Inventors: The Duy Nguyen-Tuong, Leonberg (DE); Heiner Markert, Stuttgart (DE); Jens Schreiter, Grossrueckerswalde (DE); Michael Hanselmann, Korntal (DE)

(73) Assignee: ROBERT BOSCH GMBH, Stuttgart (DE)

( * ) Notice: Subject to any disclaimer, the term of this patent is extended or adjusted under 35 U.S.C. 154(b) by 552 days.

(21) Appl. No.: 14/326,110

(22) Filed: Jul. 8, 2014

(65) Prior Publication Data

US 2015/0019464 A1 Jan. 15, 2015

(30) Foreign Application Priority Data

Jul. 9, 2013 (DE) .......................... 10 2013 213 397

(51) Int. Cl.
*G06N 5/00* (2006.01)
*G06F 1/00* (2006.01)
*G06N 99/00* (2010.01)
*G06N 5/02* (2006.01)
*G06F 17/17* (2006.01)
*G06N 7/00* (2006.01)

(52) U.S. Cl.
CPC ........... *G06N 99/005* (2013.01); *G06F 17/17* (2013.01); *G06N 5/02* (2013.01); *G06N 7/005* (2013.01)

(58) Field of Classification Search
CPC ............. G06N 5/02; G06N 5/04; G06F 17/03
See application file for complete search history.

(56) References Cited

U.S. PATENT DOCUMENTS 7,412,429 B1 *  8/2008  Syeda-Mahmood   G06K 9/6226
                                                706/45
2009/0150126 A1   6/2009  Sellamanickam et al.
2011/0257949 A1 * 10/2011 Vasudevan .............. G06F 17/18
                                                703/2

FOREIGN PATENT DOCUMENTS

WO        2013026635 A1      2/2013

OTHER PUBLICATIONS

Csato, Lehel; Opper, Manfred, "Sparse On-Line Gaussian Processes," Neural Computation 14, pp. 641-668, 2002.
(Continued)

*Primary Examiner* — Stanley K. Hill
*Assistant Examiner* — Kalpana Bharadwaj
(74) *Attorney, Agent, or Firm* — Norton Rose Fulbright US LLP; Gerard Messina

(57) ABSTRACT

A method for identifying a set of interpolation point data points from training data for a sparse Gaussian process model, encompassing the following tasks: successively selecting training data points from the set of training data for acceptance into or exclusion from a set of interpolation point data points in accordance with a selection criterion; and terminating selection when a termination criterion exists; the selection criterion depending on a divergence between a target value of the selected training data point and a function value, at the selected training data point, of the Gaussian process model based on the respectively current set of interpolation point data points.

9 Claims, 3 Drawing Sheets

(56) References Cited

OTHER PUBLICATIONS

Smola, A. J., Schoelkopf, W., "Sparse Greedy Gaussian Process Regression," Advances in Neural Information Processing Systems 13, pp. 619-625, 2001.
Seeger, M., Williams, C. K., Lawrence, N. D., "Fast Forward Selection to Speed Up Sparse Gaussian Process Regresssion," Proceedings of the 9th International Workshop on Artificial Intelligence and Statistics, 2003.
Csato, et al. "Sparse Representation for Gaussian Process Models", NIPS, vol. 13 (2001), PP. 444-450. XP055386704.
Schreiter, et al. "Sparse Gaussian Process Regression for Compliant, Real-Time Robot Control", 2015 IEEE International Conference on Robotics and Automation (ICRA), (2015), Washington, pp. 2586-2591.
Schreiter, et al. "Fast Greedy Insertion and Deletion in Sparse Gaussian Process Regression", Proceedings of the Europena Symposium on Artificial Neural Networks (ESANN 2015), (2015), pp. 1-6. XP055386700.
Schreiter, et al. "Efficient sparsification for Gaussian process regression", Neurocomputing, 192 (2016), pp. 29-37. XP029497021.

\* cited by examiner

METHOD AND APPARATUS FOR SUPPLYING INTERPOLATION POINT DATA FOR A DATA-BASED FUNCTION MODEL CALCULATION UNIT

RELATED APPLICATION INFORMATION

The present application claims priority to and the benefit of German patent application no. 10 2013 213 397.9, which was filed in Germany on Jul. 9, 2013, the disclosure of which is incorporated herein by reference.

FIELD OF THE INVENTION

The present invention relates in general to engine control devices in which function models are implemented as data-based function models. The present invention relates in particular to methods for defining data-based function models with as few interpolation point data as possible.

BACKGROUND INFORMATION

Provision is mad to use data-based function models in order to implement function models in control devices, in particular engine control devices for internal combustion engines. Parameter-free data-based function models are often used, since they can be prepared, without specific stipulations, from training data, i.e. from a set of training data points.

One example of a data-based function model is represented by the so-called Gaussian process model, which is based on Gaussian process regression. Gaussian process regression is a versatile method for data-based modeling of complex physical systems. Regression analysis is based on usually large sets of training data, so that it is useful to utilize approximative solution approaches that can be evaluated more efficiently.

For the Gaussian process model, there exists the possibility of using a sparse Gaussian process regression in which only a representative set of interpolation point data is used to prepare the data-based function model. The interpolation point data must be appropriately selected from the training data for this purpose.

The document Csató, Lehel; Opper, Manfred, "Sparse On-Line Gaussian Processes," Neural Computation 14, pp. 641-668, 2002 discloses a method for identifying interpolation point data for a sparse Gaussian process model.

Other methods relevant in this regard are known from Smola, A. J., Schölkopf, W., "Sparse Greedy Gaussian Process Regression," Advances in Neural Information Processing Systems 13, pp. 619-625, 2001; and Seeger, M., Williams, C. K., Lawrence, N. D., "Fast Forward Selection to Speed up Sparse Gaussian Process Regression," Proceedings of the 9th International Workshop on Artificial Intelligence and Statistics, 2003.

SUMMARY OF THE INVENTION

According to the present invention a method for identifying a set of interpolation point data points from training data for a sparse Gaussian process model in accordance with the description herein; and an apparatus, a system, and a computer program in accordance with the coordinated claims, are provided.

Further advantageous embodiments are described in the further descriptions herein.

In accordance with a first aspect, a method is provided for identifying a set of interpolation point data points from training data for a sparse Gaussian process model, encompassing the following steps:

successively selecting training data points from the set of training data for acceptance into or exclusion from a set of interpolation point data points in accordance with a selection criterion; and terminating selection when a termination criterion exists; the selection criterion depending on a divergence between a target value of the training data point to be selected and a function value, at the training data point to be selected, of the Gaussian process model based on the respectively current set of interpolation point data points.

The above method makes available a capability for selecting from the training data those training points which are used as interpolation point data for the sparse Gaussian process model. A fundamental idea of the above method is that of using a selection criterion to select from a training data set relevant training point data points as interpolation point data points, and to remove non-relevant training data from a given initial set of considered interpolation point data points, until a set of interpolation point data points (interpolation point data) is reached which meets a termination criterion. The selection criterion corresponds respectively to a maximum norm (in the context of acceptance) or minimum norm (in the context of exclusion of training data) at which that training data point which corresponds to a maximum error with reference to the corresponding function value of the Gaussian process model having the previously determined interpolation point data is accepted into the set of interpolation point data, and at which that training data point which corresponds to a minimum error with reference to the corresponding function value of the Gaussian process model having the remaining interpolation point data points is excluded from the set of interpolation point data points.

Using the above method it is possible to create, from a large set of training data, a sparse Gaussian process model that enables a model value to be determined in an engine control device with reduced calculation time. Because the interpolation point data are selected successively, the quality of the model resulting from the above method can be continuously monitored, e.g. with reference to an absolute error, and thus makes a possible termination criterion available.

In addition, the successive selection of training data points from the set of training data for acceptance into the set of interpolation point data points in accordance with the selection criterion can encompass the fact that in each selection cycle the selection criterion identifies for acceptance into the set of interpolation point data points that training data point whose target value maximally diverges from the function value of the Gaussian process model defined by the previously determined interpolation point data.

Provision can be made that the termination criterion encompasses ascertaining that a defined number of selected interpolation point data points has been reached, and/or ascertaining that the maximum divergence falls below a defined error threshold.

In particular, determination of the set of interpolation point data points can be carried out iteratively, such that after each determination of the set of interpolation point data points, hyperparameters based thereon are determined for the sparse Gaussian process model and the set of interpolation point data points is determined again, the iterative determination being carried out as long as an iteration criterion is met.

The iteration criterion can furthermore be met if the average divergence of the target values of the set of interpolation point data from the function values of the determined sparse Gaussian process model falls below a defined limit value.

Provision can be made that the hyperparameters for the sparse Gaussian process model are identified after determination of the set of interpolation point data.

In accordance with an alternative embodiment, the successive selection of training data points from the set of training data for exclusion from the set of interpolation point data points in accordance with the selection criterion can encompass the fact that in each selection cycle the selection criterion identifies, for exclusion from the set of interpolation point data points, that training data point whose target value diverges minimally from the function value of the Gaussian process model defined by the previously determined interpolation point data.

The termination criterion can furthermore encompass ascertaining that a defined number of selected interpolation point data points has been reached, and/or ascertaining that the minimal divergence exceeds a defined error threshold value.

In accordance with a further aspect, an apparatus is provided for identifying a set of interpolation point data points from training data for a sparse Gaussian process model, the apparatus being embodied to:
  successively select from the set of training data, in accordance with a selection criterion, training data points for acceptance into or exclusion from a set of interpolation point data points; and
  terminate selection when a termination criterion exists;
the selection criterion depending on a divergence between a target value of the training data point to be selected and a function value, at the training data point to be selected, of the Gaussian process model based on the respectively current set of interpolation point data points.

In accordance with a further aspect of the invention, a system is provided which encompasses:
  the above apparatus; and
  a control device that is embodied to receive the interpolation point data and calculate the sparse Gaussian process model.

Embodiments are described in more detail below with reference to the accompanying drawings.

DETAILED DESCRIPTION

Figure 1:
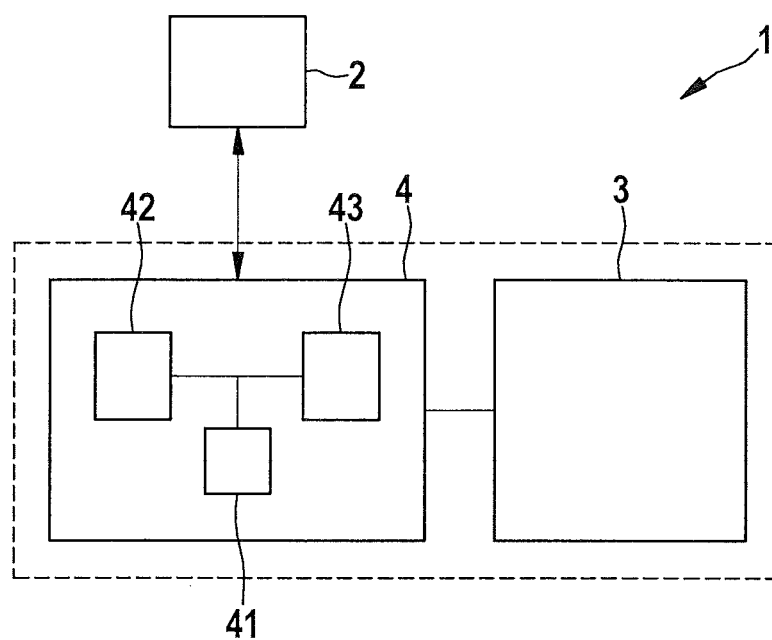
FIG. 1 schematically depicts an overall system for determining a sparse Gaussian process model, and the engine control device on which the sparse Gaussian process model is implemented.

FIG. 1 shows an assemblage 1 having a modeling system 2 that, based on training data recorded, for example, on a test stand (not shown), can determine a data-based function model, in particular a Gaussian process model. The training data make available training data points of one or more input variables and of one or more output variables that describe a behavior of a physical system 3, for example an internal combustion engine.

The use of nonparametric, data-based function models is based on a Bayesian regression method. The fundamentals of Bayesian regression are described, for example, in C. E. Rasmussen et al., "Gaussian Processes for Machine Learning," MIT Press, 2006. Bayesian regression is a data-based method that is based on a model. Creation of the model requires measurement points from training data, as well as pertinent output data of an output variable. The model is created on the basis of the use of interpolation point data that correspond entirely or in part to the training data or are generated therefrom. Abstract hyperparameters, which parameterize the space of the model functions and effectively weight the influence of the individual measurement points of the training data on the subsequent model prediction, are also identified.

The abstract hyperparameters are identified by way of an optimization method. One possibility for such an optimization method involves optimizing a "marginal likelihood" $p(Y|H,X)$. The marginal likelihood $p(Y|H,X)$ describes the plausibility of the measured y values of the training data, depicted as a vector Y, given the model parameters H and the x values of the training data, depicted as a matrix X. In model training, $p(Y|H,X)$ is maximized by looking for suitable hyperparameters that result in a profile of the model function identified by the hyperparameters and the training data, and that replicate the training data as accurately as possible. In order to simplify the calculation, the logarithm of $p(Y|H,X)$ is maximized, since the logarithm does not modify the smoothness of the plausibility function.

The Gaussian process model is calculated in accordance with the calculation protocol below. The input values $\tilde{u}_d$ for a test point u (input variable vector) are first normalized and centered in accordance with the following formula:

$$u_d = \frac{\tilde{u}_d - (m_x)_d}{(s_x)_d}.$$

in which $m_x$ corresponds to the mean function with respect to a mean of the input values of the interpolation point data, $s_x$ to the variance of the input values of the interpolation point data, and d to the index for the dimension D of the test point u.

The following is obtained as a result of creating the nonparametric data-based function model:

$$v = \sum_{i=1}^{N} (Q_y)_i \sigma_f \exp\left(-\frac{1}{2} \sum_{d=1}^{D} \frac{((x_i)_d - u_d)^2}{l_d}\right).$$

The model value v thereby obtained is normalized using an output normalization operation, specifically in accordance with the formula:

$$\tilde{v} = v s_y + m_y,$$

in which v corresponds to a normalized model value (output value) at a normalized test point u (input variable vector of the dimension D), $\tilde{v}$ to a (non-normalized) model value (output value at a (non-normalized) test point $\tilde{u}$ (input variable vector of the dimension D), $x_i$ to an interpolation point of the interpolation point data, N to the number of interpolation points of the interpolation point data, D to the dimension of the input data/training data/interpolation point data space, and $I_d$ and $\sigma_f$ to the hyperparameters from the model training. The vector $Q_y$ is a variable calculated from the hyperparameters and the training data. In addition, $m_y$ corresponds to the mean function with respect to a mean of the output values of the interpolation point data, and $s_y$ to the variance of the output values of the interpolation point data.

Modeling system 2 furthermore executes a method for processing the training data that are determined or supplied, in order to make the data-based function model available with the aid of hyperparameters and interpolation point data that represent a subset of the training data. A so-called "sparse" Gaussian process model is thereby created.

These interpolation point data and hyperparameters are then transferred into a control device 4 and stored there. Control device 4 is connected to a physical system 3, e.g. an internal combustion engine, that is operated with the aid of the data-based function model.

FIG. 1 furthermore schematically depicts a hardware architecture for an integrated control module 4, for example in the form of a microcontroller, in which a main calculation unit 42 and a model calculation unit 43 for entirely hardware-based calculation of a data-based function model are provided in integration fashion. The hyperparameters and interpolation point data are stored in a memory unit 41. Main calculation unit 42, memory unit 41, and model calculation unit 43 are connected to one another via an internal communication connection 44, for example a system bus.

Main calculation unit 42, provided as a microcontroller, is embodied to calculate, with the aid of a software-identified algorithm, function values of the data-based function model that has been supplied. Provision is made to use model calculation unit 43 in order to speed up calculation and relieve stress on microcontroller 42. Model calculation unit 43 is embodied entirely in hardware, and is suitable only for carrying out a specific calculation protocol that is based substantially on repeated calculations of a sum, a multiplication, and an exponential function. Model calculation unit 43 is therefore essentially hard-wired, and accordingly not embodied to execute a software code as in the case of main calculation unit 42.

A solution in which model calculation unit 43 makes a restricted, highly specialized instruction set available for calculating the data-based function model is alternatively possible. In no embodiment, however, is a processor provided in model calculation unit 43. This makes possible resource-optimized implementation of this type of model calculation unit 43, or an area-optimized layout using an integrated configuration.

Not only conventional Gaussian process models but also sparse Gaussian process models can be calculated in a control device 4 of this kind. Because the volume of interpolation point data is appreciably smaller in sparse Gaussian process models than in conventional Gaussian process models, the memory capacity of memory unit 41 to be provided for storing the interpolation point data can be reduced, or multiple data sets of training data from multiple sparse Gaussian process models can be stored in memory unit 41.

It is possible in particular, when creating sparse Gaussian process models, to select the interpolation points of the interpolation point data that are used to be the same for multiple models, so as thereby to save even more memory space. This makes it possible to calculate multiple sparse Gaussian process models using the same interpolation point data.

Figure 2:
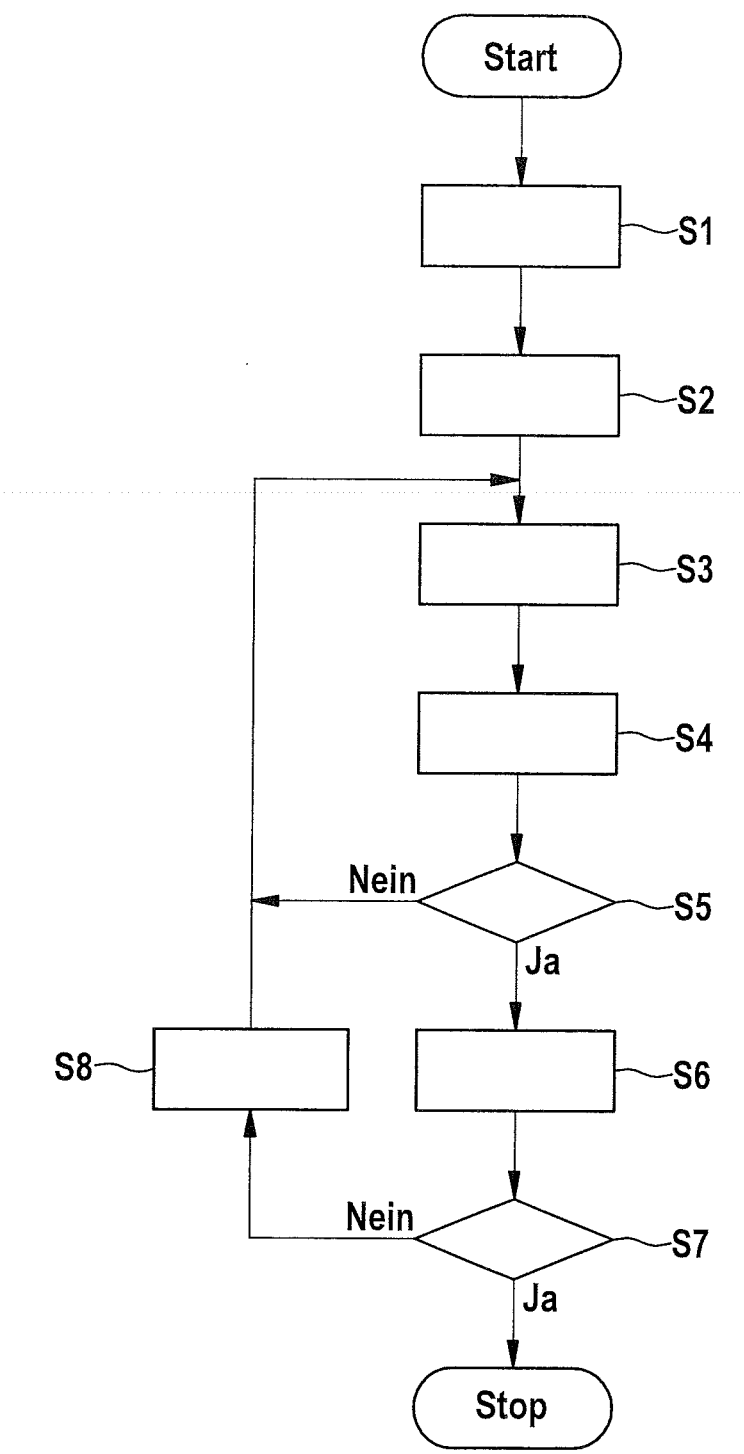
FIG. 2 is a flow chart to illustrate a method for supplying hyperparameters and interpolation point data, in accordance with a first embodiment.

FIG. 2 is a schematic flow chart to illustrate a method for supplying a sparse Gaussian process model having hyperparameters and interpolation point data.

For this, in step S1 the training data, determined via a test system or in another manner, which describe physical system 3 to be modeled, or a part thereof to be modeled, are supplied. The training data encompass one or more input variables as well as one or more output variables. For subsequent explanation, the training data are given in the form of a training data set $D=\{x_i,y_i\}$ having the training data points $x_i = \Re^d$ in the input space and the real target values of an output variable $y_i \in \Re$. The basis of the Gaussian process regression is accordingly the regression model $y=f(x)+E$, where $EN(0,\sigma_2)$ is distributed in centered normal fashion. Step S2 then supplies initial hyperparameters, for example $\sigma^2$, a mean function, and the matrix H. Values for termination criteria, for example the desired number of interpolation points a and/or a stipulation regarding an error threshold value $\Delta_{eps}$, can also be defined.

In step S3 a first training data point is then selected as a candidate for selection as a first interpolation point of the interpolation point data to be generated. The relevant first training data point can be selected randomly or, for example, a training data point can be selected from the training data that are located in the center, or in a center region, of the set of training data points. Alternatively, the training data point selected as the first interpolation point can be one that is at a maximum distance from the defined mean function M.

Step S4 then defines, based on the first interpolation point, a Gaussian process function whose function value corresponds to an expected value $\mu$ that corresponds to the target value of the relevant first training data point.

The a priori distribution of the vector $f \in \Re^n$ of the function values is induced by the covariance function $k(x_i,x_j)$ to be defined and the expected value function $m(x_i)$ for i, $j \in \{1 \ldots n\}$, which leads to $P(f|X)=N(f|m, K)$. $X \in \Re^{n \times d}$ combines all training data points as interpolation point data points, $K \in \Re^{n \times n}$ combines all covariance function values between the training data points, and the vector $m \in \Re^n$ combines the values of the expectation function. In contrast to Gaussian process regression, in sparse Gaussian process regression the distribution $P(y|f,X)$ of all target values is approximated by the distribution $Q(y|f_I,X)=N(y|K^T_{I,*}K_I^{-1}f_I,\sigma^2 I)$. This approximation is determined by the active training data points, i.e. interpolation point data points $x_i$ where $i \in I \subseteq \{1, \ldots, n\}$. The index set I of cardinality $m \ll n$ describes only a portion of the complete covariance matrix or the complete function value vector, producing the calculation advantage as compared with a complete Gaussian process regression $I=\{1, \ldots, n\}$. Bayes' law yields the approximate a posteriori distribution $Q(f|y,X)$ having the expected value $$\mu = E(Q(f|y,X)) = m + K_{I,*}^T(\sigma^2 K_I + K_{I,*}K_{I,*}^T)^{-1}K_{I,*}(y-m) \in \Re^n$$

with regard to the considered interpolation point data points from X, wherein m corresponds to a defined mean function. This can be defined, for example, as $m=0$.

For selection of an interpolation point, the square of the error between the target values y of the output variable of the training data point and the function values estimated by way of the expectation value $\mu$ with respect to the Euclidean norm are then minimized, i.e. $\|y-\mu\|_2^2 \to \min$. Because of the equivalence of norms in finite-dimensional spaces, it follows that $\|y-\mu\|^2_2 \leq n\|y-\mu\|^2_\infty = n(\max_{i=1,\ldots,n}|y_i-\mu_i|) \to \min$. The selection criterion for the maximum error is thus defined by $\Delta_i = |y_i - \mu_i|$.

Correspondingly, in step S4 a further interpolation point data point having $x_j$ where $j \in R = \{1, \ldots, n\} \setminus I$ is accepted into the set of interpolation points to be embodied, i.e. into the index set I, when $j = \arg\max_{i \in R}(\Delta_i)$.

Step S5 queries whether the defined number a of interpolation points has been reached, or if the most recently discovered maximum distance of the target values of the training data from the expected value of the sparse Gaussian process function based on the previously identified interpolation points falls below the defined error threshold value $\Delta_{eps}$. If one of the two conditions is met ("Yes" branch), the method continues with step S6. Otherwise ("No" branch) execution loops back to step S4 by the fact that new partial matrices $K_I$ and $K_{I,*}$ of the complete covariance matrix K, based on the interpolation point data supplemented by a further interpolation point data point and a corresponding expectation value, are calculated. The previously selected hyperparameters are not modified in the context of the Gaussian process function that is thereby re-determined and has the previously selected training data points.

Once it has been ascertained that a specific number of interpolation points has been determined and the maximum errors fall below the defined error limit $\Delta_{eps}$, in step S6 the interpolation point data thereby determined are used to determine hyperparameters for the interpolation point data which correspond best to the training data, in particular to the real target values at the interpolation points of the interpolation point data.

The above method for selecting training data for addition to the interpolation point data can then be carried out again as a function of an iteration criterion. The iteration criterion evaluates the quality of the determined sparse Gaussian process model based on the hyperparameters determined in step S6 and the interpolation point data determined by way of steps S3 to S5. If it is ascertained with the test of the iteration criterion in step S7 that the hyperparameters and the determined interpolation point data do not replicate the training data with sufficient accuracy ("No" branch), then in step S8 the previously determined interpolation point data are discarded, the hyperparameters re-determined in step S6 are retained, and the above-described method is carried out again from steps S3 to S6. If, on the other hand, the check of the iteration criterion in step S7 finds that the hyperparameters and the determined interpolation point data replicate the training data with sufficient accuracy ("Yes" branch), then the method is ended and the interpolation point data and hyperparameters are transferred into control device 4 so that the calculation of the sparse Gaussian process model can be performed therein.

With the method above, a sparse Gaussian process model is determined which enables simple, in particular resource-conserving calculation. In addition, the selection criterion corresponds to the procedure that those training data points which exhibit the greatest absolute error on the current model are accepted as interpolation point data points, with the result that the training data point most poorly explained by the data-based function model in that cycle is selected.

The result is to aim toward a minimization of the absolute error, which is significant in a very large number of practical problems. The selection criterion thus represents the basis for an iterative algorithm by successively enlarging the active set of interpolation point data. The fact that $\Delta$ falls below $\Delta_{eps}$ is used as a termination criterion if the desired accuracy is already reached early on, i.e. before the number a of interpolation point points is reached; this also has a positive effect on calculation time.

Figure 3:
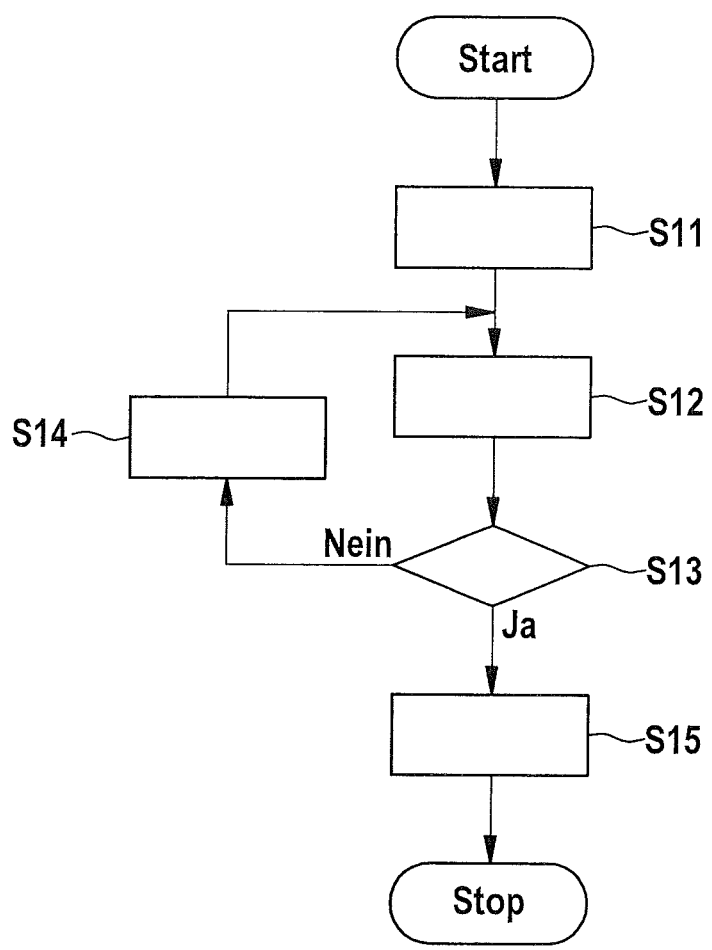
FIG. 3 is a flow chart for supplying hyperparameters and interpolation point data, in accordance with a second embodiment.

FIG. 3 is a flow chart to illustrate a further method for supplying a sparse Gaussian process model having a reduced set of interpolation point data points.

The method begins in step S11 with provision of a sparse or complete Gaussian process model having previously determined hyperparameters and training data. The complete Gaussian process model was determined previously with the aid of conventional methods in terms of the training data supplied.

In order to generate a sparse Gaussian process model, provision is then made to remove training data points from the set of training data of the complete or sparse Gaussian process model, and to generate from the training data an (even more) sparse Gaussian process model, based on the existing hyperparameters and the remaining interpolation point points. For this, in step S12 the corresponding expected value or function value is determined, for each of the real target values of the output variable that are indicated by the training data, based on the existing Gaussian process model, and is weighted or scaled with a prediction vector a $$\alpha = (\sigma^2 K_I + K_{I,*} K_{I,*}^T)^{-1} K_{I,*}(y-m) \in \mathfrak{R}^m$$

where $$\mu = m + K_{I,*}^T \alpha$$

That active training data point $x_i$ whose error $\Delta_i = \alpha_i |y_i - \mu_i|$ corresponds to a minimum of all previously calculated errors ($i = \arg\min_{j \in I}(\Delta_i)$) is removed from the currently considered set I of training data. Because the expected value $\mu$ and the prediction vector $\alpha$ represent the essential parameters of the sparse regression model, the criterion of deletion to the maximum error does not create any additional calculation outlay.

After removal of the training data point from the training data set, step S13 checks whether the number b of interpolation points has reached or fallen below a predefined value, and whether the remaining interpolation points supply an error $\Delta$ that is greater than or equal to a defined error limit value $\Delta_{eps}$.

If neither of the above conditions is met ("No" branch), then in step S14 the partial matrices of the covariance matrix of the remaining training data are determined again, and by a branch to step S12 the method is carried out again with the existing hyperparameters in order to delete a further training point.

If one or both of the above conditions is met ("Yes" branch), then in step S15 the existing set of interpolation point data and the hyperparameters are supplied as the sparse Gaussian process model to be determined, and stored in memory unit 41.

What is claimed is:

1. A method for identifying a set of interpolation point data points from training data for implementing a sparse Gaussian process model in an engine control module having a main unit, a memory unit, and a model calculation unit, the method comprising:
   successively selecting training data points from the set of training data for acceptance into or exclusion from a set of interpolation point data points in accordance with a selection criterion; and
   terminating selection when a termination criterion exists;
   wherein the selection criterion depends on a divergence between a target value of the training data point to be selected and a function value, at the training data point to be selected, of the Gaussian process model based on the respectively current set of interpolation point data points;

wherein the model calculation unit is hard-wired or uses a restricted, specialized instruction set, and wherein the sparse Gaussian model enables a model value to be determined by the main unit in the engine control module, wherein the training data points are of at least variable that describes a physical behavior of an internal combustion engine, wherein at least one of the following is satisfied: (i) the successive selection of the training data points from a set of training data for acceptance into the set of interpolation point data points in accordance with the selection criterion provides that in each selection cycle the selection criterion identifies for acceptance into the set of interpolation point data points a particular training data point having a target value which maximally diverges from a function value of the sparse Gaussian process model defined by a previously determined interpolation point data, and (ii) the successive selection of training data points from the set of training data for exclusion from the set of interpolation point data points in accordance with the selection criterion that includes the fact that in each selection cycle the selection criterion identifies, for exclusion from the set of interpolation point data points, that training data point whose target value diverges minimally from the function value of the sparse Gaussian process model defined by the previously determined interpolation point data, wherein hyperparameters and the interpolation point data are stored in the memory unit, wherein the model calculation unit is configured only for carrying out a specific calculation protocol that is based on repeated calculations of a sum, a multiplication, and/or an exponential function, and wherein the hyperparameters are for the Gaussian model and are determined based on the interpolation point data.

2. The method of claim 1, wherein the termination criterion encompass ascertaining that a defined number of selected interpolation point data points has been reached, and/or ascertaining that the maximum divergence falls below a defined error threshold.

3. The method of claim 1, wherein determination of the set of interpolation point data points is carried out iteratively, such that after each determination of the set of interpolation point data points, the hyperparameters based thereon are determined for the sparse Gaussian process model and the set of interpolation point data points is determined again, the iterative determination being carried out as long as an iteration criterion is met.

4. The method of claim 3, wherein the iteration criterion is met if the average divergence of the target values of the set of interpolation point data from the function values of the determined sparse Gaussian process model falls below a defined limit value.

5. The method of claim 1, wherein the hyperparameters for the sparse Gaussian process model are identified after determination of the set of interpolation point data.

6. The method of claim 1, wherein the termination criterion includes ascertaining that a defined number of selected interpolation point data points has been reached, and/or ascertaining that the minimal divergence exceeds a defined error threshold value.

7. An engine control module apparatus for identifying from training data a set of interpolation point data points for implementing a sparse Gaussian process model, comprising:
a memory unit;
a model calculation unit; and
a main unit having a processor arrangement configured to perform the following:
successively selecting from the set of training data, in accordance with a selection criterion, training data points for acceptance into or exclusion from a set of interpolation point data points; and
terminating selection when a termination criterion exists;
wherein the selection criterion depends on a divergence between a target value of the training data point to be selected and a function value, at the training data point to be selected, of the sparse Gaussian process model based on the respectively current set of interpolation point data points;
wherein the model calculation unit is hard-wired or uses a restricted, specialized instruction set, and
wherein the sparse Gaussian model enables a model value to be determined by the main unit in the engine control module,
wherein the training data points are of at least variable that describes a physical behavior of an internal combustion engine,
wherein at least one of the following is satisfied: (i) the successive selection of the training data points from a set of training data for acceptance into the set of interpolation point data points in accordance with the selection criterion provides that in each selection cycle the selection criterion identifies for acceptance into the set of interpolation point data points a particular training data point having a target value which maximally diverges from a function value of the sparse Gaussian process model defined by a previously determined interpolation point data, and (ii) the successive selection of training data points from the set of training data for exclusion from the set of interpolation point data points in accordance with the selection criterion that includes the fact that in each selection cycle the selection criterion identifies, for exclusion from the set of interpolation point data points, that training data point whose target value diverges minimally from the function value of the sparse Gaussian process model defined by the previously determined interpolation point data,
wherein hyperparameters and the interpolation point data are stored in the memory unit,
wherein the model calculation unit is configured only for carrying out a specific calculation protocol that is based on repeated calculations of a sum, a multiplication, and/or an exponential function, and
wherein the hyperparameters are for the Gaussian model and are determined based on the interpolation point data.

8. A system, comprising:
an engine control module apparatus for identifying from training data a set of interpolation point data points for implementing a sparse Gaussian process model, including:
a memory unit;
a model calculation unit; and
a main unit having a processor arrangement configured to perform the following:
successively selecting from the set of training data, in accordance with a selection criterion, training data points for acceptance into or exclusion from a set of interpolation point data points; and terminating selection when a termination criterion exists;

wherein the selection criterion depends on a divergence between a target value of the training data point to be selected and a function value, at the training data point to be selected, of the sparse Gaussian process model based on the respectively current set of interpolation point data points;

wherein the engine control module is configured to receive the interpolation point data and calculate the sparse Gaussian process model;

wherein the model calculation unit is hard-wired or uses a restricted, specialized instruction set, and wherein the sparse Gaussian model enables a model value to be determined by the main unit in the engine control module, wherein the training data points are of at least variable that describes a physical behavior of an internal combustion engine, wherein at least one of the following is satisfied: (i) the successive selection of the training data points from a set of training data for acceptance into the set of interpolation point data points in accordance with the selection criterion provides that in each selection cycle the selection criterion identifies for acceptance into the set of interpolation point data points a particular training data point having a target value which maximally diverges from a function value of the sparse Gaussian process model defined by a previously determined interpolation point data, and (ii) the successive selection of training data points from the set of training data for exclusion from the set of interpolation point data points in accordance with the selection criterion that includes the fact that in each selection cycle the selection criterion identifies, for exclusion from the set of interpolation point data points, that training data point whose target value diverges minimally from the function value of the sparse Gaussian process model defined by the previously determined interpolation point data, wherein hyperparameters and the interpolation point data are stored in the memory unit, wherein the model calculation unit is configured only for carrying out a specific calculation protocol that is based on repeated calculations of a sum, a multiplication, and/or an exponential function, and wherein the hyperparameters are for the Gaussian model and are determined based on the interpolation point data.

9. An electronic control device, comprising:

a computer readable medium having a computer program, which is executable by a processor, including a program code arrangement having program code for identifying from training data a set of interpolation point data points for a sparse Gaussian process model, by performing the following:

successively selecting from the set of training data, in accordance with a selection criterion, training data points for acceptance into or exclusion from a set of interpolation point data points; and terminating selection when a termination criterion exists;

wherein the selection criterion depends on a divergence between a target value of the training data point to be selected and a function value, at the training data point to be selected, of the sparse Gaussian process model based on the respectively current set of interpolation point data points;

wherein the model calculation unit is hard-wired or uses a restricted, specialized instruction set, and wherein the sparse Gaussian model enables a model value to be determined by the main unit in the engine control module, wherein the training data points are of at least variable that describes a physical behavior of an internal combustion engine, wherein at least one of the following is satisfied: (i) the successive selection of the training data points from a set of training data for acceptance into the set of interpolation point data points in accordance with the selection criterion provides that in each selection cycle the selection criterion identifies for acceptance into the set of interpolation point data points a particular training data point having a target value which maximally diverges from a function value of the sparse Gaussian process model defined by a previously determined interpolation point data, and (ii) the successive selection of training data points from the set of training data for exclusion from the set of interpolation point data points in accordance with the selection criterion that includes the fact that in each selection cycle the selection criterion identifies, for exclusion from the set of interpolation point data points, that training data point whose target value diverges minimally from the function value of the sparse Gaussian process model defined by the previously determined interpolation point data, wherein hyperparameters and the interpolation point data are stored in the memory unit, wherein the model calculation unit is configured only for carrying out a specific calculation protocol that is based on repeated calculations of a sum, a multiplication, and/or an exponential function, and wherein the hyperparameters are for the Gaussian model and are determined based on the interpolation point data.

* * * * *